United States Patent
Kwok et al.

(10) Patent No.: US 9,401,346 B2
(45) Date of Patent: Jul. 26, 2016

(54) OPTICAL BUS IN 3D INTEGRATED CIRCUIT STACK

(71) Applicants: Chee Yee Kwok, St Ives (AU); Aron Michael, Dollspoint (AU); Yiwei Xu, Ashfield (AU)

(72) Inventors: Chee Yee Kwok, St Ives (AU); Aron Michael, Dollspoint (AU); Yiwei Xu, Ashfield (AU)

(73) Assignees: Chee Yee Kwok, St. Ives (AU); Aron Michael, Dollspoint (AU); Yiwei Xu, Ashfield (AU)

( * ) Notice: Subject to any disclaimer, the term of this patent is extended or adjusted under 35 U.S.C. 154(b) by 0 days.

(21) Appl. No.: 14/592,930

(22) Filed: Jan. 9, 2015

(65) Prior Publication Data

US 2015/0206856 A1    Jul. 23, 2015

Related U.S. Application Data

(63) Continuation of application No. 13/808,323, filed as application No. PCT/AU2011/000838 on Jul. 4, 2011, now Pat. No. 8,958,667.

(30) Foreign Application Priority Data

Jul. 5, 2010   (AU) ................ 2010902977

(51) Int. Cl.
*G02B 6/12* (2006.01)
*G02B 6/00* (2006.01)
(Continued)

(52) U.S. Cl.
CPC .............. *H01L 25/0657* (2013.01); *G02B 6/12* (2013.01); *G02B 6/12002* (2013.01);
(Continued)

(58) Field of Classification Search
CPC ... H01L 23/00; H01L 23/544; H01L 25/0657; H01L 24/70; H01L 2223/54426; H01L 2924/01014; H01L 2225/06527; H01L 2225/06534; H01L 2924/00; H01L 2924/0002; H01L 21/302; H01L 2924/14; G02B 6/12; G02B 6/12002; G02B 6/12004; G02B 6/4201; G02B 6/4204; G02B 6/43
USPC .......... 385/14, 24, 31, 39, 129–132, 134, 136, 385/137; 257/E21.002, 678, 686, 797; 438/29, 31, 32
See application file for complete search history.

(56) References Cited

U.S. PATENT DOCUMENTS 6,473,553 B1 * 10/2002  Jerman et al. ................. 385/137
7,964,947 B2 * 6/2011  Mohammed et al. ......... 257/686

OTHER PUBLICATIONS

Yoshimura, T. et al. "Three-Dimensional Optical Circuits Consisting of Waveguide Films and Optical ZConnections", J. Lightwave Tech., vol. 24(11), Nov. 2006, p. 4345-4352.

(Continued)

*Primary Examiner* — Akm Enayet Ullah
*Assistant Examiner* — Michael Mooney
(74) *Attorney, Agent, or Firm* — Harness, Dickey & Pierce, PLC

(57) ABSTRACT

An optical bus of an integrated circuit comprises: a polymer waveguide, a micromirror, and an optical coupler. The polymer waveguide is disposed in a via formed through at least one die layer of the integrated circuit comprising an active circuit. The micromirror is disposed adjacent to the via and optically coupled to the polymer waveguide. The optical coupler is connected to the polymer waveguide to couple the active circuit to the optical bus. A stacked integrated circuit is described comprising such an optical bus. A method of fabricating a rear 45° micromirror on a silicon substrate that can be used in the optical bus is also described. Furthermore, alignment/lock mechanisms for use in a stacked integrated circuit comprising first and second silicon substrates are described.

5 Claims, 9 Drawing Sheets

(51) Int. Cl.
  *H01L 23/544* (2006.01)
  *H01L 25/065* (2006.01)
  *G02B 6/42* (2006.01)
  *G02B 6/43* (2006.01)
  *H01L 21/302* (2006.01)
  *H01L 23/00* (2006.01)

(52) U.S. Cl.
  CPC ............... *G02B 6/4201* (2013.01); *G02B 6/43* (2013.01); *H01L 21/302* (2013.01); *H01L 23/544* (2013.01); *H01L 24/70* (2013.01); *G02B 6/12004* (2013.01); *G02B 6/4204* (2013.01); *G02B 2006/12104* (2013.01); *H01L 2223/54426* (2013.01); *H01L 2225/06527* (2013.01); *H01L 2225/06534* (2013.01); *H01L 2924/0002* (2013.01); *H01L 2924/01014* (2013.01); *H01L 2924/14* (2013.01)

(56) References Cited

OTHER PUBLICATIONS

Xu, Y. et al., "A novel technique of fabricating rear 45° micromirror for stacked die optical interconnect", Proc. Chem. vol. 1, 2009, p. 1167-1170.

\* cited by examiner

OPTICAL BUS IN 3D INTEGRATED CIRCUIT STACK

CROSS-REFERENCE TO RELATED APPLICATIONS

This application is a continuation of U.S. patent application Ser. No. 13/808,323 filed on Jan. 4, 2013 which is a National Stage of International Application No. PCT/AU2011/000838, filed Jul. 4, 2011. The entire disclosures of each of the above applications are incorporated herein by reference.

FIELD

The present invention relates generally to integrated circuits and, in particular, to three-dimensional integrated circuit stacks.

BACKGROUND

The ever growing demand for greater functionality and better performance from integrated circuits and systems have been addressed in part by shrinking the size of transistors and interconnections. While the switching speed of transistors has improved remarkably, signal propagation speed along metal interconnects has not, because the fundamental RC time constant does not scale down with dimensional scaling. This is aggravated at very high frequencies (>10 GHz) where the parasitic inductive/capacitive effect and skin effects cannot be ignored. Even with the implementation of complex System-on-Chip (SoC) and Systems-in-Package (SiP) to provide enhanced functionality, metal interconnect (even with Cu) delays remain a major road block to enhancing speed performance.

Two technological developments have helped to improve, to some extent, speed performance: (i) low-k dielectrics to reduce the capacitance between tracks/substrate, and (ii) three dimensional integration with through silicon vias (TSV), where silicon chips (or dies) are stacked and bonded one on top of the other and electrically connected vertically by metal (Cu) through these TSVs. In spite of these technological advancements, industry recognises that scaling deteriorates the performance of interconnects and that deterioration has already become a significant limiter in overall circuit performance. ITRS2008 (International Road Map for Semiconductors) reports that as additional layers of silicon chips are stacked, the RC time constant improvement from three-dimensional integration flattens out. The problem is further exacerbated as technology and industry moves below the 45 nm node.

Conventional systems have the following characteristics: (a) connectivity between various levels of a 3D die stack only uses metal interconnect in through silicon vias (TSVs); (b) silicon photonics are only focused at the silicon die level; and (c) PCB optical connectivity uses polymer waveguides.

SUMMARY

In accordance with an aspect of the invention, there is provided an optical bus of an integrated circuit. The bus comprises: a polymer waveguide disposed in a via formed through at least one die layer of the integrated circuit, the die layer comprising an active circuit; a micromirror disposed adjacent the via and optically coupled to the polymer waveguide in the via; and an optical coupler connected to the polymer waveguide of the via for coupling the active circuit of the die layer to the optical bus.

The active circuit is formed in semiconductor material. The semiconductor material may be formed in or on a substrate.

The active circuit is formed on or in a substrate. The substrate may be a silicon substrate; the via may be a through-silicon via; and the optical coupler may be a silica-to-silicon coupler.

The optical coupler is fabricated from a material reducing optical mismatch between the polymer waveguide and semiconductor material of the active circuit.

The substrate may be a semiconductor substrate, or have semiconductor material formed on or adjacent the substrate.

The optical bus may comprise polymer material disposed in a bypass channel formed in the die layer. The bypass channel may be situated adjacent to the optical coupler. The optical axis of the optical coupler may be disposed orthogonally or substantially orthogonally to the optical axis of the polymer waveguide in the via.

The micromirrors may be 45 degree micromirrors. At least one micromirror may be a face-up micromirror. Further, at least one micromirror may be a face-down micro mirror.

The optical bus may comprise: a pair of vias formed in the die layer, the vias separated from one another; polymer waveguides formed in the vias; micromirrors disposed adjacent the vias; and the optical coupler coupled to the polymer waveguide and the at least one active circuit.

In accordance with another aspect of the invention, there is provided a stacked integrated circuit, comprising: at least one die layer comprising an active circuit; an optical bus as described with respect to the foregoing aspect of the invention, wherein the polymer waveguide is disposed in the via formed through the die layer of the integrated circuit, the micromirror being disposed adjacent the via and optically coupled to the polymer waveguide in the via, the optical coupler being connected to the polymer waveguide of the via for coupling the active circuit of the die layer to the optical bus, wherein the polymer waveguide in the via, the micromirror, and the optical coupler form the optical bus defining the optical path through the integrated circuit.

The integrated circuit may comprise: two or more die layers each having a substrate and at least one active circuit formed in or on the substrate, the die layers stacked one upon another to form a stacked integrated circuit; a pair of vias formed in each die layer, the vias separated from one another; polymer waveguides formed in the vias; a face-down micromirror disposed adjacent each via; a plurality of optical couplers, the optical coupler of each layer coupled to a corresponding one of the polymer waveguides in the via and the at least one active circuit of the layer.

The integrated circuit may comprise: a face-up micromirror formed in the substrate of each layer situated at an opposite end of the optical coupler of the layer relative to the face-down micromirror, the optical path including the face-up micromirror.

The face-up micromirror of one layer may be aligned with a polymer waveguide disposed in a via of another layer, the layers abutting each other.

In accordance with a further aspect of the invention, there is provided a method of fabricating a rear 45° micromirror on a silicon substrate. The method comprises the steps of: forming a front 45° micromirror in a surface of a doped silicon substrate; oppositely doping the surface of the doped silicon substrate to form a diffused layer over the front 45° micromirror; applying a chromium (Cr) film over at least a portion of the diffused layer of the micromirror; etching away the silicon substrate beneath the diffused layer of the micromirror; etching away the diffused layer from the surface of silicon substrate and between the substrate portions except where the Cr layer overlies the remaining portion of the Cr layer; removing the Cr layer leaving an angled structure of the diffused layer projecting over the lip or edge of the silicon substrate; and depositing a suitable metal film on a lower surface of the angled structure to provide a reflective layer.

The metal film may comprise gold (Au) or tin (Sn).

The silicon substrate may be doped P-type, and the diffused layer may be N+ doped.

The etching away of the silicon substrate may comprise the use of an electrochemical TMAH etch stop technique applied to the silicon substrate.

In accordance with yet a further aspect of the invention, there is provided an alignment/lock mechanism for use in a stacked integrated circuit comprising first and second silicon substrates. The mechanism comprises: a pair of pre-shaped silicon springs formed in the first substrate, the springs oppositely facing each other; and a pin formed in the second substrate, the pin and the pair of silicon springs adapted for snap-fit engagement in a central portion of the silicon springs.

The opposing pre-shaped silicon springs may be formed in an elongated region of the first substrate.

The springs may bulge towards each other from opposite sides and in the central portions of the springs, an indentation may be formed in each spring, to which the locking pin can snap fit.

In accordance with yet another aspect of the invention, there is provided a stacked integrated circuit, comprising first and second silicon substrates comprising an alignment/lock mechanism as described in the foregoing aspect of the invention.

The first and second silicon substrates may comprise a plurality of such alignment/lock mechanisms situated in different portions of the first and second silicon substrates.

BRIEF DESCRIPTION OF THE DRAWINGS

Embodiments of the invention are described hereinafter with reference to the drawings, in which.

DETAILED DESCRIPTION

Figure 1:
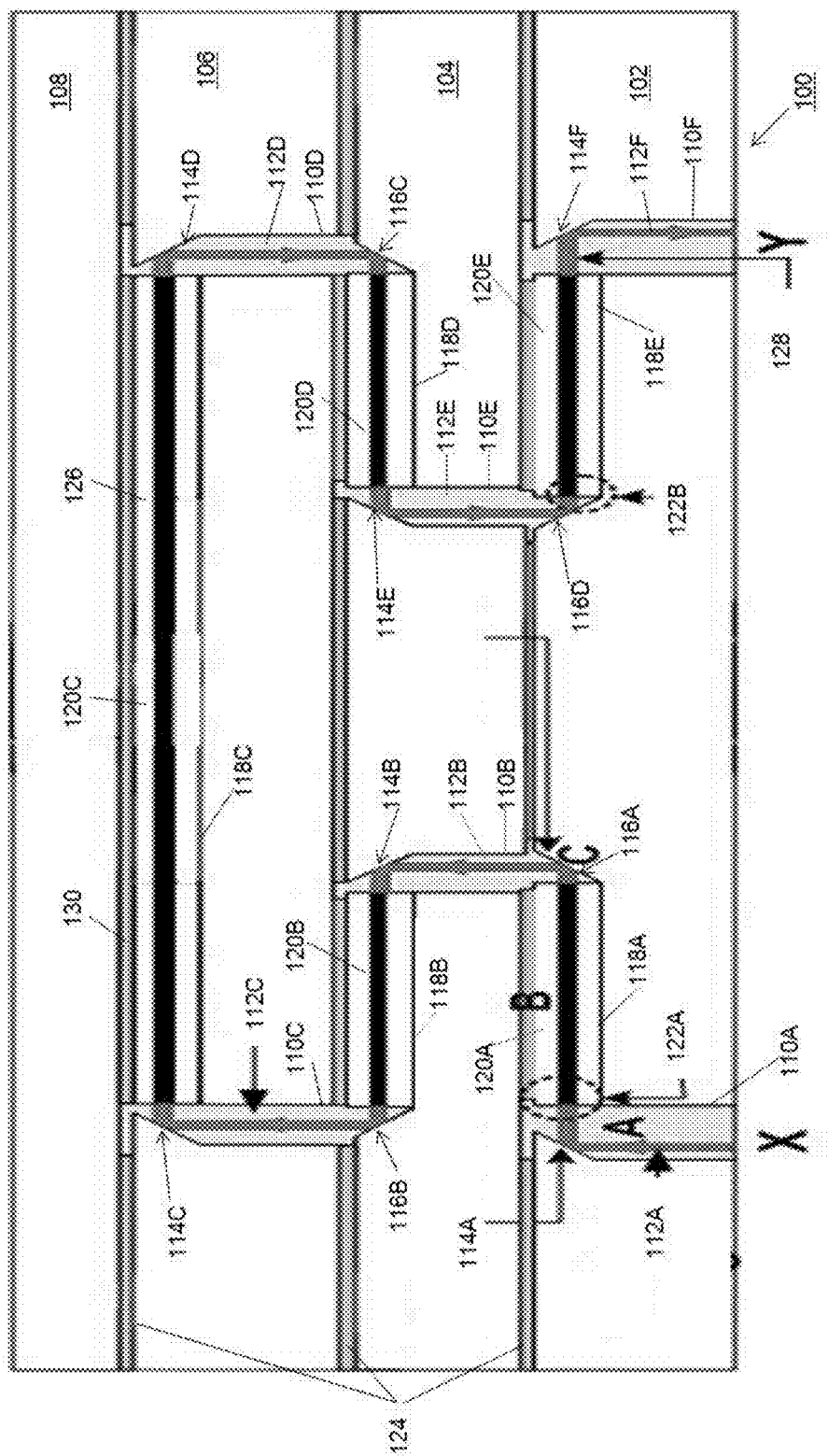
FIG. 1 is a cross-sectional view of an optical path through a 3D, integrated-circuit stack having three die layers for purposes of illustration.

An optical bus of an integrated circuit, a stacked integrated circuit, a method of fabricating a rear 45° micromirror on a substrate, and an alignment/lock mechanism for use in a stacked integrated circuit are disclosed hereinafter. In the following description, numerous specific details, including particular semiconductor materials, metals, etchants, polymers, and the like are set forth. However, from this disclosure, it will be apparent to those skilled in the art that modifications and/or substitutions may be made without departing from the scope and spirit of the invention. In other circumstances, specific details may be omitted so as not to obscure the invention.

The embodiments of the invention have application to three-dimensional (3D) integrated circuit fabrication technology and optical interconnects. This technology can be used in high performance chips, such as microprocessors, and enable optical connectivity at various hierarchical levels of the integration process. One embodiment of the invention provides a mechanism for establishing optical interconnectivity between semiconductor photonics at the chip level and polymer photonics at the printed circuit board (PCB) level, through a stack of semiconductor dies/chips in 3D integration using self-written photo-polymer waveguides with sets of front and rear 45° micromirrors, through-silicon-vias (TSV) and optical couplers. The semiconductor dies/chips are preferably silicon dies/chips. An embodiment of the invention addresses (i) the large mode field mismatch between semiconductor (e.g., silicon) waveguides (e.g., located at the silicon die level) and polymer waveguides (at the PCB level); (ii) physical location at different levels in a 3D die stack, by bridging this gulf. This enables optical connectivity between semiconductor photonics at the die/chip level in a 3D stack to a polymer waveguide on a PCB. The embodiments of the invention provide a mechanism for optical signals in the semiconductor chip/die to communicate with devices on the printed circuit board. Optical interconnects provided by the embodiments of the invention meet the need for high speed broadband communication and high performance processors.

Advantageously, the embodiments of the invention use self-written photo-polymer waveguides in TSVs in 3D integration to establish optical connectivity between semiconductor photonics at the semiconductor level and polymer photonics at the PCB level. The self-writing photo-polymer in the TSVs is used in combination with prefabricated waveguides coupled to photonic devices. The semiconductor may be silicon and the waveguides may be silica. The embodiments of the invention also use micromirrors as part of the optical path, and in particular the implementation of front and rear 45° micromirrors within the TSVs allows out of plane optical connectivity. Furthermore, the embodiments of the invention provide an alignment mechanism or feature using pre-shaped springs and pin to facilitate easy and accurate alignment of the optical path.

The following embodiment of the invention describes a semiconductor substrate. However, other substrates may be practiced. The semiconductor materials for the active circuit may be bulk semiconductor or non-bulk semiconductor. Preferably, the bulk semiconductor is silicon. For non-bulk semiconductor material, the active device may be fabricated using silicon-on-insulator (SOI) technology, or silicon-on-sapphire (SOS) technology. In SOI technology, a layer of $SiO_2$ is formed on a silicon substrate. In turn, the semiconductor (e.g., silicon) material for the active device is formed as a layer on the insulator (SiO$_2$) layer. Such SOI technology is well known to those skilled in the art. For SOS technology, a layer of semiconductor material (e.g., silicon) is formed on a sapphire substrate and the active device is formed in that semiconductor material.

Optical Bus

FIG. 1 illustrates an integrated circuit 100 with an optical bus 130 defining an optical path 126 passing through a three-layer stack 100 comprising three layers 102, 104, 106. The three layers 102, 104, 106 are stacked one upon another (from bottom to the top of the drawing), and each comprise a semiconductor substrate. As shown in FIG. 1, the layers 102 are elongated in cross-section. While three layers 102, 104, 106 are depicted in FIG. 1, more or fewer layers may be practiced without departing from the scope of the invention.

Six vias 110A, 110B, 110C, 110D, 110E, 110F, by way of example, are depicted in vertical arrangements through the thickness dimension of the relevant layers 102, 104, 106. The vias 110A-110F are elongated cavities through the layers and are filled by polymer waveguides 112A-112F, respectively. As depicted in FIG. 1, each polymer waveguide comprises a vertical waveguide component and a horizontal waveguide component. To simplify the drawing, only the horizontal waveguide component 128 of the polymer waveguide 112F through layer 102 is so labelled.

The optical bus 130 comprises polymer waveguides 112 in the vias 110, micromirrors 112, and polymer material (e.g. silica) 120, as an optical coupler, across the semiconductor substrate in an orientation that is out of plane with the polymer waveguides 112. Furthermore, the polymer waveguide material 112 in the vias 110 is injected in the by-pass channel beside the optical coupler 120, but is not a waveguide since light travels along the silica waveguide 120. Each die layer may comprise an active circuit (not shown in FIG. 1) formed in the relevant semiconductor substrate 102, 104, 106. If the optical bus 130 is not to be coupled to an active circuit of any layer, the relevant bypass channel 118 may omit an optical coupler 120 and be filled only with polymer waveguide 112, forming part of the optical bus 130. In layers, where the optical coupler 120 is present, the optical coupler 120 forms part of the optical bus 130.

Rear 45° micromirrors 114A-114F are each disposed adjacent the top of the respective vias 110A-110F and optically coupled to the polymer waveguides 112A-112F and the optical couplers 120, where a layer has such an optical coupler, and polymer waveguides in the bypass channels 118, where a layer does not have an optical coupler. As shown for layer 102, the optical couplers 120A and 120E are butt coupled to the horizontal components of polymer waveguides 112A and 112F in the vias 110A and 110F, respectively. Similar connections apply to the other layers 104 and 106. The optical bus 130 also comprises a number of front 45° micromirrors 116A-114D in layers 102 and 104 of FIG. 1.

In any layer 102, 104, 106, the optical bus 130 can comprise polymer waveguides 112 in vias 110, the micromirrors 114 and 116, and optical coupler 120 defining an optical path 126 through the integrated circuit 100. In the embodiment of FIG. 1, the substrates 102, 104, 106 are preferably silicon substrates; the vias 110 are through-silicon vias; and the optical couplers are silica-to-silicon couplers.

The optical axis of each of the optical coupler 120 is disposed orthogonally or substantially orthogonally to the longitudinal axis of the polymer waveguides 112 in the vias 110. The optical couplers 120 are fabricated from a material reducing optical mismatch between the polymer waveguide 112 and the semiconductor material of the active device. A top layer 108 overlays the die layer 106 (e.g., for experimental purposes, this might be glass). The bypass channel 118 is situated adjacent to the optical coupler 120. The micromirrors 116 are face-up micromirrors, and the micromirrors 114 are facedown micromirrors. Fabrication of the micromirrors 116 and 114 is described in greater detail hereinafter. In die layer 106, the optical bus 130 comprises a pair of vias 110C and 110D formed in the die layer 106. The vias 110C and 110D of the layer 106 are separated from one another. The same applies to the vias 110 in the other layers 102 and 104. Micromirrors 114C and 114D of the layer 106 are formed adjacent the through silicon vias 110C and 110D. An optical coupler 120C is coupled to the polymer waveguide 112C and the active circuit (not shown) of the layer 106.

More particularly, as shown in FIG. 1, the optical path 126 is formed through silicon stack layers 102, 104, and 106. The stack 100 has self-written polymer waveguides 112 formed in TSVs 110 through the layers 102, 104, 106. A light beam 126 enters the stack at port X on the left, traverses the stack both vertically and horizontally so as to exit port Y on the right side of the stack through the bottom surface, as depicted in FIG. 1. A bonding material 124 is used between die layers 102, 104, 106 and layer 108 to adhere or fasten the layers in the stack. A layer of bonding material is approximately 1-2 um thick, and could be an Au—Sn eutectic bond, for example.

The optical bus 130 aims to establish a low-loss single mode optical link between the silicon photonics in the stack 102, 104, 106 of integrated circuits 100 and the polymer interconnects on the PCB (not shown in FIG. 1). The cross sectional schematic of the optical link as illustrated in FIG. 1 comprises at each level: (i) through silicon vias (TSV) 110 with a monolithically integrated 45° rear (facing-down) micro-mirror 114 at the top of the TSV; (ii) planar silica waveguide coupler 120, and (iii) 45° front (facing-up) micro-mirror 114. The through silicon hole 110 is connected to the facing up 45° micro-mirror 116 by a micro-machined by-pass channel 118 that runs alongside of the silica waveguide coupler. This is shown in greater detail in FIG. 2. The optical link and the micro-machined by-pass channel are sealed by Au/Sn eutectic bonding after alignment and lock has been established.

Figure 2:
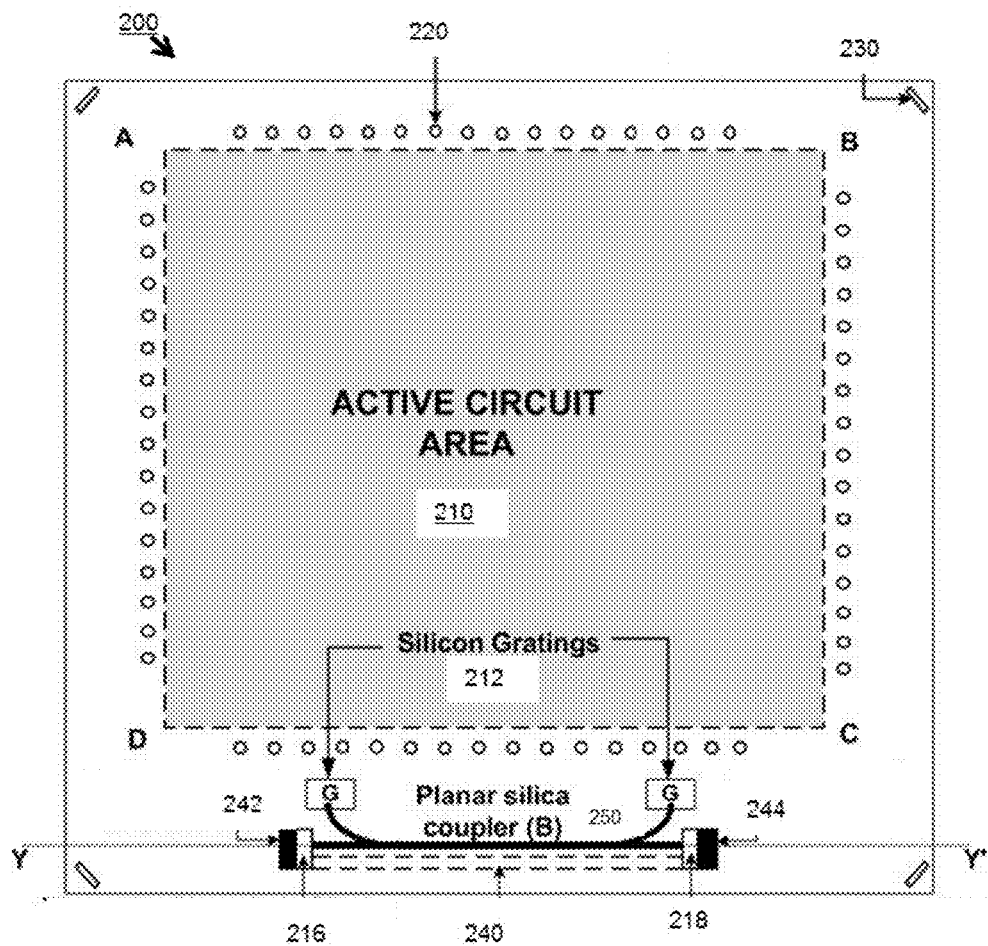
FIG. 2 is a plan view of an integrated circuit having an active circuit area and showing one possible placement of the optical path and electrical interconnects on a single layer of FIG. 1.

Referring to FIG. 2, a single die layer 204 is depicted, which is a part of the stacked integrated circuit 200. The bulk of the surface of the layer 204 shown in FIG. 2 is an active circuit area 210, depicted as a square area. Around the periphery of the active circuit area 210 are a plurality of TSV electrical interconnects 220. At each of the four corners of the layer 204 are alignment features/mechanisms 230 described in detail hereinafter. Through silicon vias 216 and 218 are shown in FIG. 2 at the bottom of the layer 230. The TSVs 216 and 218 are filled with polymer waveguides, preferably photo-sensitive polymers. The TSV 216 is coupled to a face-down 45° micromirror 242, with the face of the micromirror 242 oriented to face right in the diagram. The TSV 218 is coupled to a face-up 45° micromirror 244 (this micromirror could alternatively be a face-down micromirror), with the face of the micromirror 244 oriented to face left in the diagram. The bypass channel 240 (depicted with dashed lines) is disposed between the two mirrors 242, 244 and the vias 216, 218. Also coupled between the TSVs 216 and 218 is a planar silica-to-silicon coupler 250, which is also coupled to a pair of silicon gratings 212, to couple to the silicon photonics active circuit area. Alternatively, instead of silicon gratings 212, a tapered (e.g., silica) waveguide, which changes beamwidth, might be practiced.

Fabricating Optical Bus

A fabrication technique has been developed to fabricate the rear 45° micromirror. With reference to FIG. 1, TSVs are initially fabricated in each layer 102, 104, 106 before the layers are stacked. Once the layers are stacked in alignment, the photopolymer is then injected into the TSV 110 from the bottom level at X. The injection process is assisted by reducing the pressure in the flow path by pumping out at the other port Y. Polymer flows up from the TSV 110 into the by-pass channel 118 (in FIG. 1) that leads to the front (facing-up) 45° micro-mirror 116 and proceeds into the TSV of the next level 104.

Whilst FIG. 1 shows the optical path 126, the polymer flow path is similar in the through silicon holes. FIG. 2 shows that in the planar silica-to-silicon coupler region 250, polymer flows through the by-pass channel, Bp, 240. This filling process is followed by pre-bake to semi-solidify the liquid photopolymer. In practical situations, the stack is attached to the base of the package or the PCB. Entry ports X and Y can be used directly. With careful alignment, the writing laser beam is launched into the photopolymer at both entry points X and Y, the vertical and horizontal photopolymer waveguides are written at all levels. The planar silica-to-silicon coupler 250 allows the writing laser beam to propagate between the horizontal polymer waveguides.

Using photo-sensitive polymers allows the self-focusing effect of the exposing laser light in the photo-sensitive polymer. At the appropriate wavelength, typically 488 nm for photosensitive polyimide resin for example, an increase in the refractive index between the exposed and unexposed portion of the photopolymer is induced. By using a 488 nm laser write beam at X and Y, a self-written waveguide can be created. Such an approach is more tolerant to slight physical misalignment. A special platform incorporating the micro-positioners can be constructed allowing precision alignment with the optical path in the stack of silicon chips for experimentation with the writing of the photopolymer waveguide. Once an acceptable alignment is achieved, the writing operation begins. Then thermosetting process is used to induce polymerization and fabrication of the cladding portion of the self-written waveguides 112.

One of the crucial issues in optical interconnect schemes is the physical alignment of various structures, located on different levels, in the desired optical path. Whilst direct writing of the photopolymer waveguide from both ends of the optical path may make lining up various components more tolerant to misalignment, precise physical alignment is needed to achieve low loss optical propagation. Anisotropic etching properties of silicon that produces well-defined cavities (like inverted pyramidal pits and V-grooves) and protrusions (mesas) formed by the <111> planes may be utilised. The top substrate can have protrusions on the bottom surface whilst the lower substrate can have the cavities on the top surface. Ideally, the alignment features should mate and fit nicely, but poor etch rate uniformity makes precise control of features sizes difficult. A further alignment feature/mechanism is described hereinafter.

Optical-Interconnect System Using Front & Rear Micromirrors

The aspects of the invention provide a free-space optical interconnect system using a front and rear 45° micromirror pair for vertical optical signal transmission within a die stack. Fabrication techniques for the front and rear 45° micromirror on <100> silicon surface are discussed. Optical interconnect has great potential for die-to-die communication inside a single package. Starting with a <100> orientation silicon wafer, fabrication of an extended 45° silicon slope <110> plane forms an enlarged micromirror structure. Interlocking alignment features are included in the front and rear micromirror substrate. The rear (face down) 45° micromirror can be fabricated using the face-up micromirror as the starting framework together with an appropriate solid state diffusion and electrochemical etch stop technique. Optical test has been conducted on the optical-interconnect system comprising a front and rear 45° micromirror pair.

Face Up Micromirror

Figure 3:
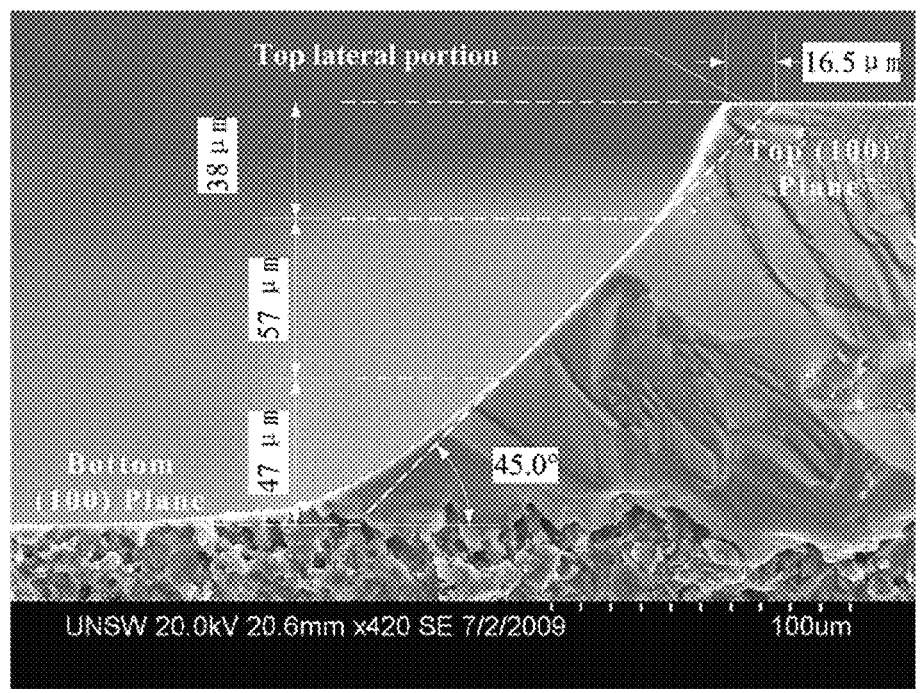
FIG. 3 is a scanning-electron-microscope (SEM) image of a cross-sectional view of a front 45° (face-up) micro-mirror that may be practiced in FIGS. 1 and 2.

FIG. 3 is a SEM picture illustrating in cross-section a high quality 45° front (face up) micromirror, which may be practiced as mirrors 116 and 244 in the devices 100, 200 of FIGS. 1 and 2. The details of the structure of face up micromirrors and methods of fabricating such micromirrors are disclosed in the following references:

(1) Y. W. Xu, A. Michael, C. Y. Kwok, (2008) 'Techniques for improvement of 45° micromirrors", APCOT 2008: Asia-Pacific Conference on Transducers and Micro-Nano Technology, Tainan, Taiwan, 22-25 Jun. 2008; and (2) Y. W. Xu, A. Michael, C. Y. Kwok, (2008) "Investigation of low TMAH concentration solution with NCW-601 and TRITON X-100 surfactant on silicon surface", Eurosensors XXII 2008, Dresden, 7-10 Sep. 2008, pp. 924-927.

The front (face up) 45° micromirror can be fabricated on a <100> silicon surface using anisotropic etchant composing 10% TMAH, for example, and 1% NCW-1002 surfactant, which gives an etch selectivity R<100>/R<110> around 1.4. Successive removal of the overhanging oxide mask can be employed to minimize the top curved portion on the micromirror slope to allow an enlarged 45° effective reflective portion. By successively removing overhanging oxide, the height of straight 45° reflective portion can be increased (e.g., from 29 µm to 57 µm).

Face Down Micromirror

Figure 4A:
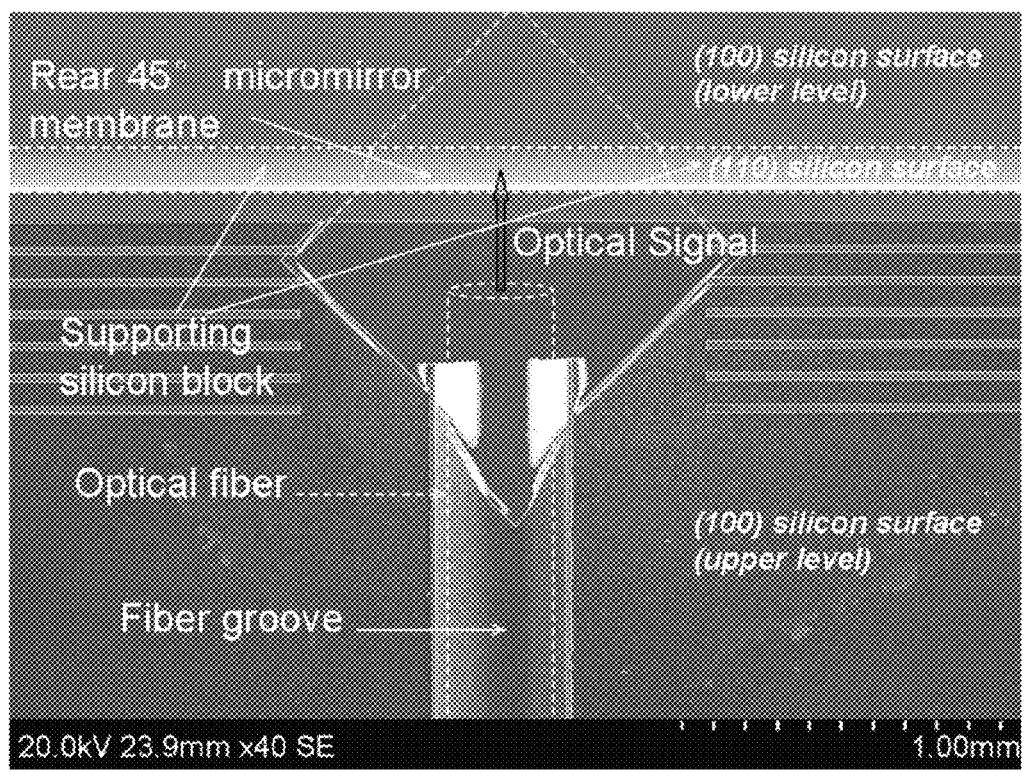
FIGS. 4A and 4B are scanning-electron-microscope (SEM) images of a rear 45° (face-down) micro-mirror seen through a TSV.
Figure 4B:
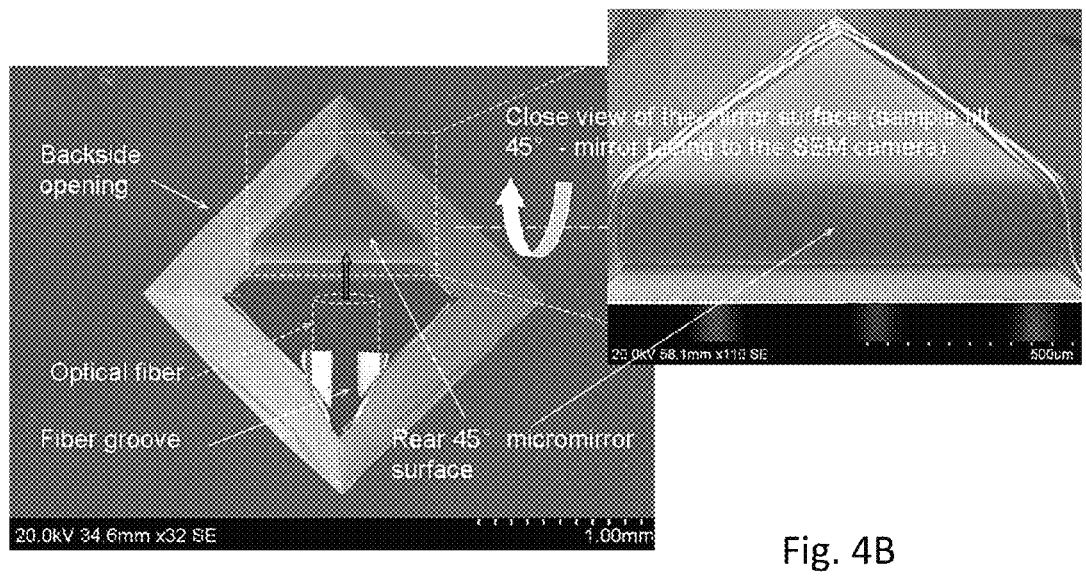

FIGS. 4A and 4B are SEM pictures illustrating in cross-section a high quality 45° rear (face down) micromirror, which may be practiced as mirrors 114, and 242 in the devices 100, 200 of FIGS. 1 and 2. FIG. 4A is a top view of a rear 45° micromirror, and FIG. 4B is a backside view of the rear 45° micromirror. For measurement purposes, a fiber groove has an optical fiber and is formed in the <100> orientation silicon surface (upper level). An optical signal is output from the optical fiber to the rear 45° micromirror. FIG. 4A is the rear micromirror structure seen from the top. In this perspective, the surface of the rear 45° micromirror is not visible, but its corresponding front side is. The location of the group for placement of the optical fibre is clearly visible. The fibre is use to collect the optical signal for measurement purposes only and is not used in an actual implementation in a 3D stacked die configuration. FIG. 4B is a view from the bottom of the rear 45° micromirror where the surface of the rear 45° micromirror is clearly visible but the grove for the fibre is not. An enlarged view of the rear 45° micromirror surface is inserted.

Figure 7:
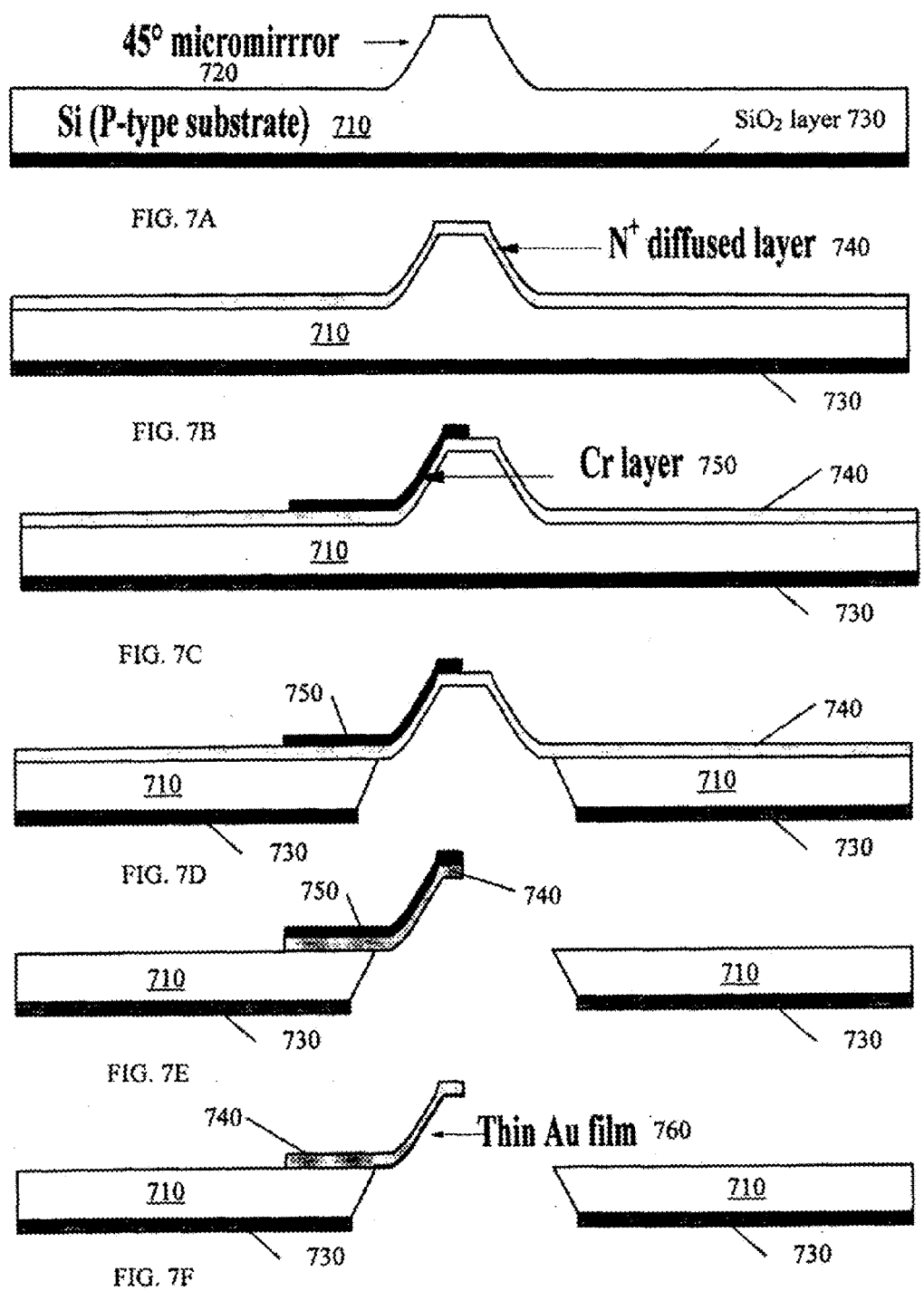
FIGS. 7A-7F are cross-sectional views of a rear 45° micromirror being fabricated.
Figure 8:
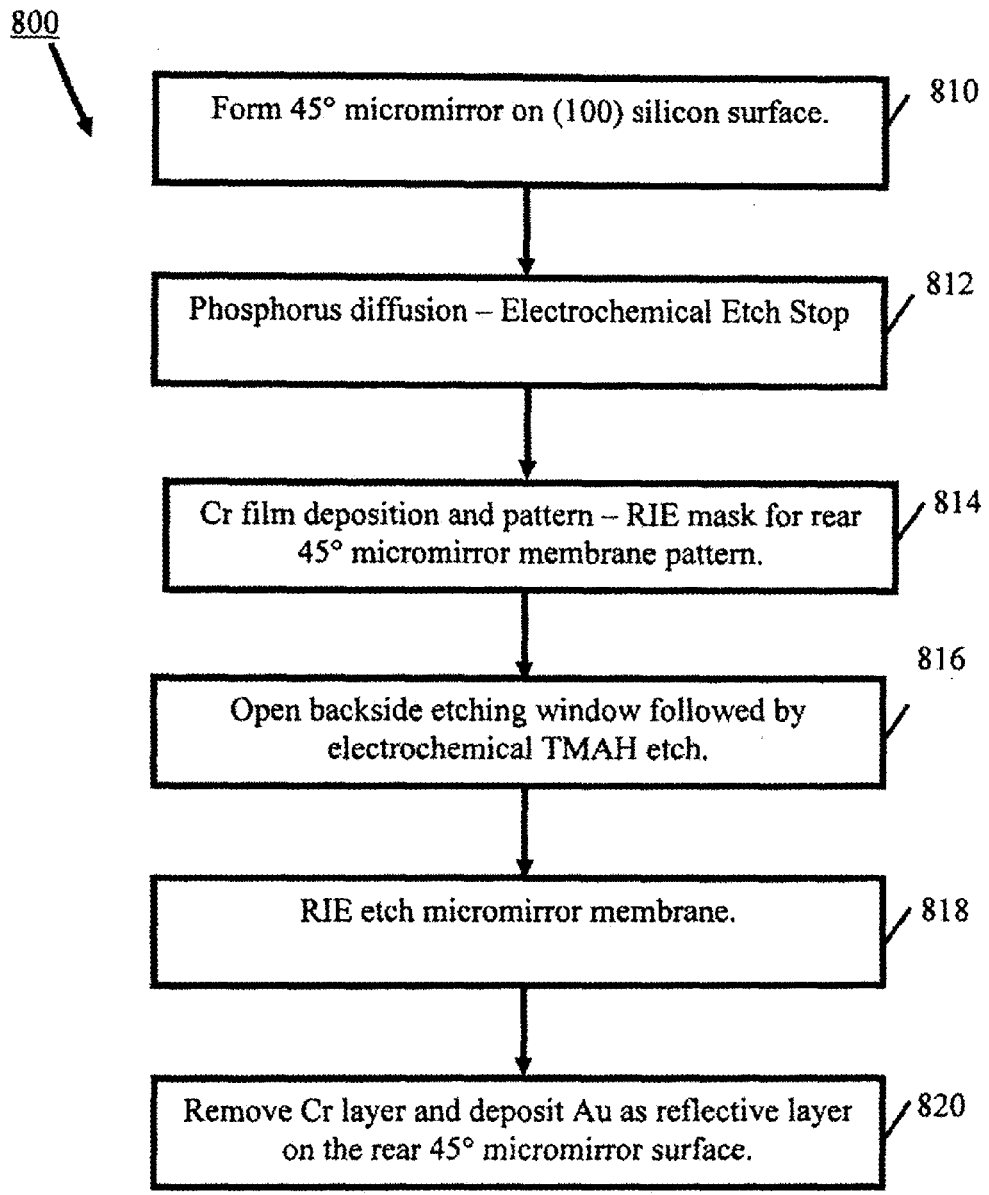
FIG. 8 is a flow diagram of a method of fabricating the rear 45° micromirror of FIG. 7F.

FIGS. 7 A to 7F illustrate the fabrication of a rear 45° micromirror. FIG. 8 is a flow diagram illustrating the method 800 to fabricate the micromirror of FIG. 7. Processing commences at step 810. In step 810, (an ultra-smooth) front 45° micromirror 720 is formed on the (100) silicon substrate 710 (P-type substrate), as shown in FIG. 7A. The bottom surface of the substrate 710 has a SiO$_2$ layer 730 formed therein. In step 812, phosphorous diffusion is carried out to form the N+ diffused layer 740 over the top surface of the substrate 710, including the face up micromirror 720, as shown in FIG. 7B. The electrochemical etch stop is a technique to stop the etching process from the back side of the wafer—determined by the thickness of the diffused layer on the front side. In step

814, chromium (Cr) film deposition and photolithographical patterning is applied, which acts as the etch mask (FIG. 7C) for rear 45° micromirror membrane when reactive ion etching is conducted from the front side of the wafer, as shown in FIG. 7D. Chromium is deposited all across the wafer; the photolithographic patterning as determined by the mask design leaves the Cr where Cr is required.

In step 816, a backside etching window is opened in the SiO2 layer 730 and is followed by electrochemical TMAH etch of the silicon substrate 710 beneath the mesa structure of the N+ diffused layer 740 and overlying Cr layer 750, as depicted in FIG. 7D. The portion of the silicon substrate beneath the mesa structure N+ diffused layer 740 is entirely etched away.

In step 818, the micromirror membrane 740 is RIE etched from the front, removing the N+ diffused layer 740 from the top surface of the substrate and between the substrate portions 710 except where the Cr layer 750 overlays the remaining portion of layer 740, as depicted in FIG. 7E. In step 820, the Cr layer 750 is removed leaving behind the reversed-Z structure of layer 740 projecting over the lip or edge of left side of the substrate 710, and a thin film of gold (Au) is deposited on the lower surface of layer 740 as a reflective layer on the rear 45° micromirror surface, as shown in FIG. 7F. Processing then terminates.

Alignment/Lock Feature or Mechanism

Figure 5:
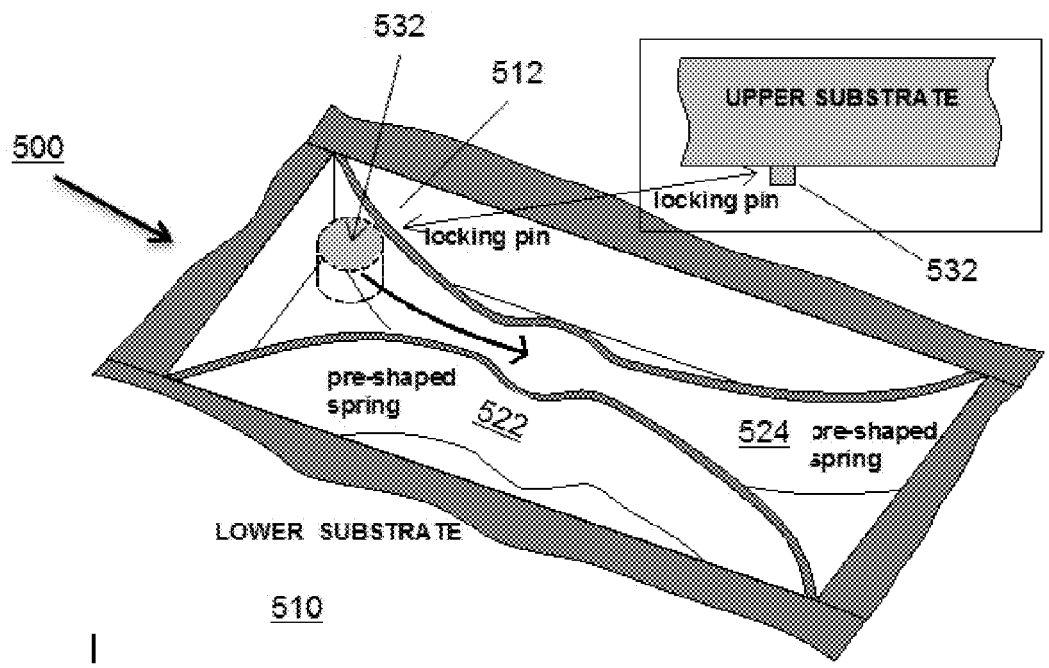
FIG. 5 is a perspective view of an alignment/lock mechanism using pre-shaped silicon springs, with a blow up view of an upper substrate with a locking pin.

FIG. 5 illustrates is a single alignment/lock feature 500 comprising a pre-shaped silicon spring pair 522, 524 in the lower substrate (chip) 510 and a corresponding pin 532 on the back surface of the upper substrate (chip) 530. The opposing pre-shaped springs 522 and 524 are formed in an elongated region 512 in the lower substrate 510. The springs 522 and 524 bulge towards each other from opposite sides, but in the central portions, there is an indentation formed in each spring 522, 524, to which the locking pin 532 can snap fit when pulled into position there.

Figure 6:
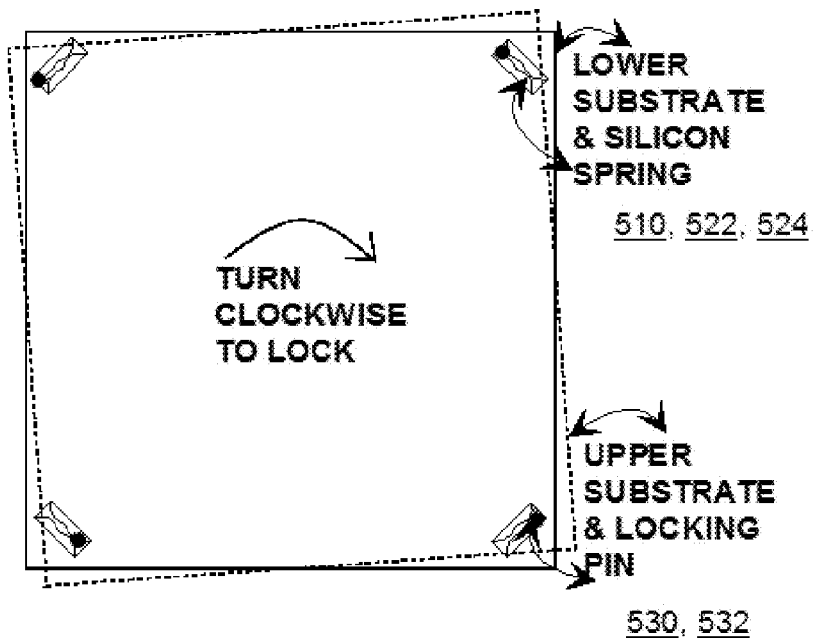
FIG. 6 is a top plan view of alignment/lock features on a chip (wafer)

As shown in FIG. 6, the top and lower substrates 510, 530 are brought together slightly out of alignment but positioned in the empty space 512 near the spring support. The lower substrate 510 is depicted to have silicon springs 522, 524 in each of the four corners of the top surface of the substrate 110. Corresponding pins 532 are formed in each corner of the bottom surface of the upper substrate 530. A slight clockwise twist sends the pins 532, belonging to the upper substrate, into the locking position between the pair of pre-shaped springs 522, 524.

FIG. 6 shows four sets of such alignment and lock features as an example. The pins 532 and springs 522, 524 can be fabricated by deep reactive ion etching (RIE) of silicon using an STS ICP-RIE tool. The size of the pins 532 and pre-shaped silicon springs 522, 524 have to be appropriately designed to exert the desired amount of force to keep the two substrates 510, 530 well aligned. Again, the concept is illustrated FIG. 6 at the chip level. Adaptation to wafer level alignment requires appropriately locating these 4 sets of alignment/lock structures at properly reference coordinates on the wafer, but lateral shift may be preferred instead of twist.

Alternative Alignment/Lock Feature or Mechanism

Figure 9A:
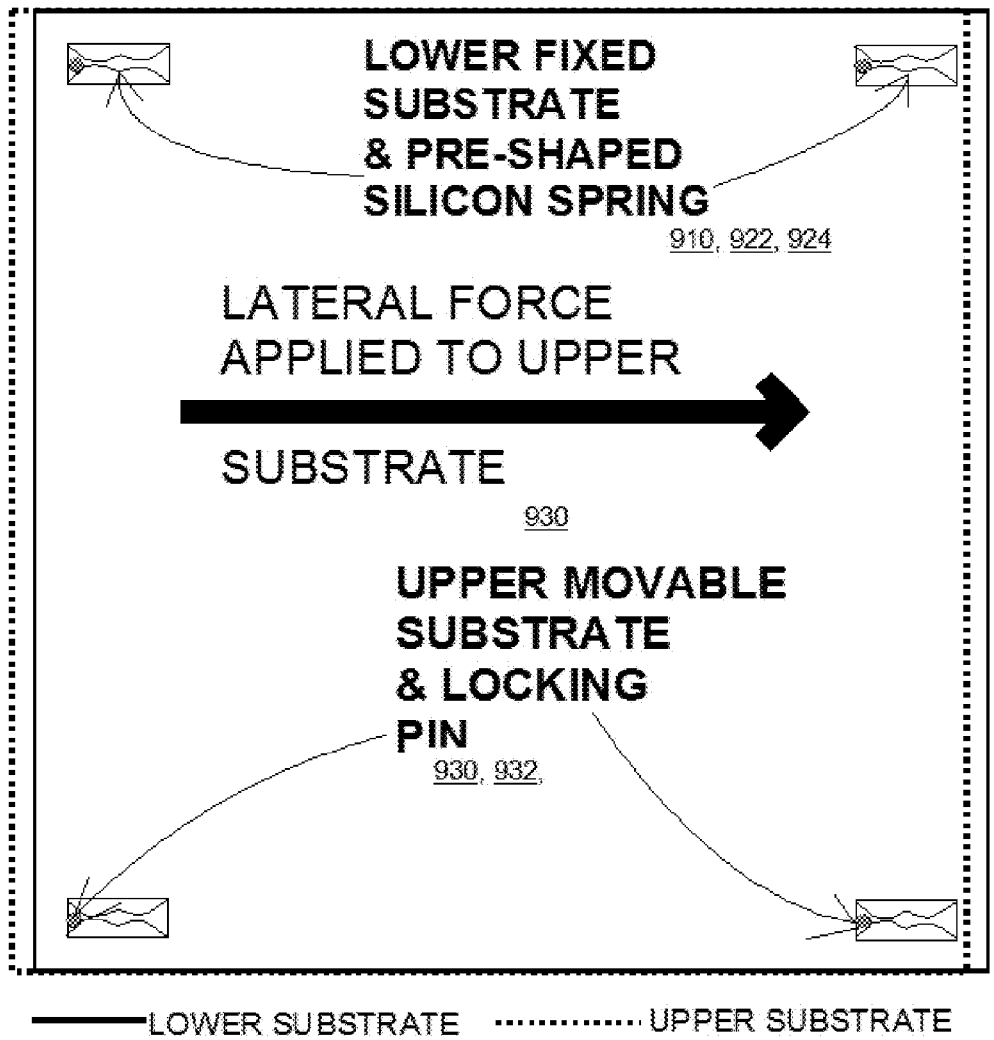
FIG. 9A is a perspective view of an alternative alignment/lock mechanism using pre-shaped silicon springs, with a blow up view of an upper substrate with a locking pin.
Figure 9B:
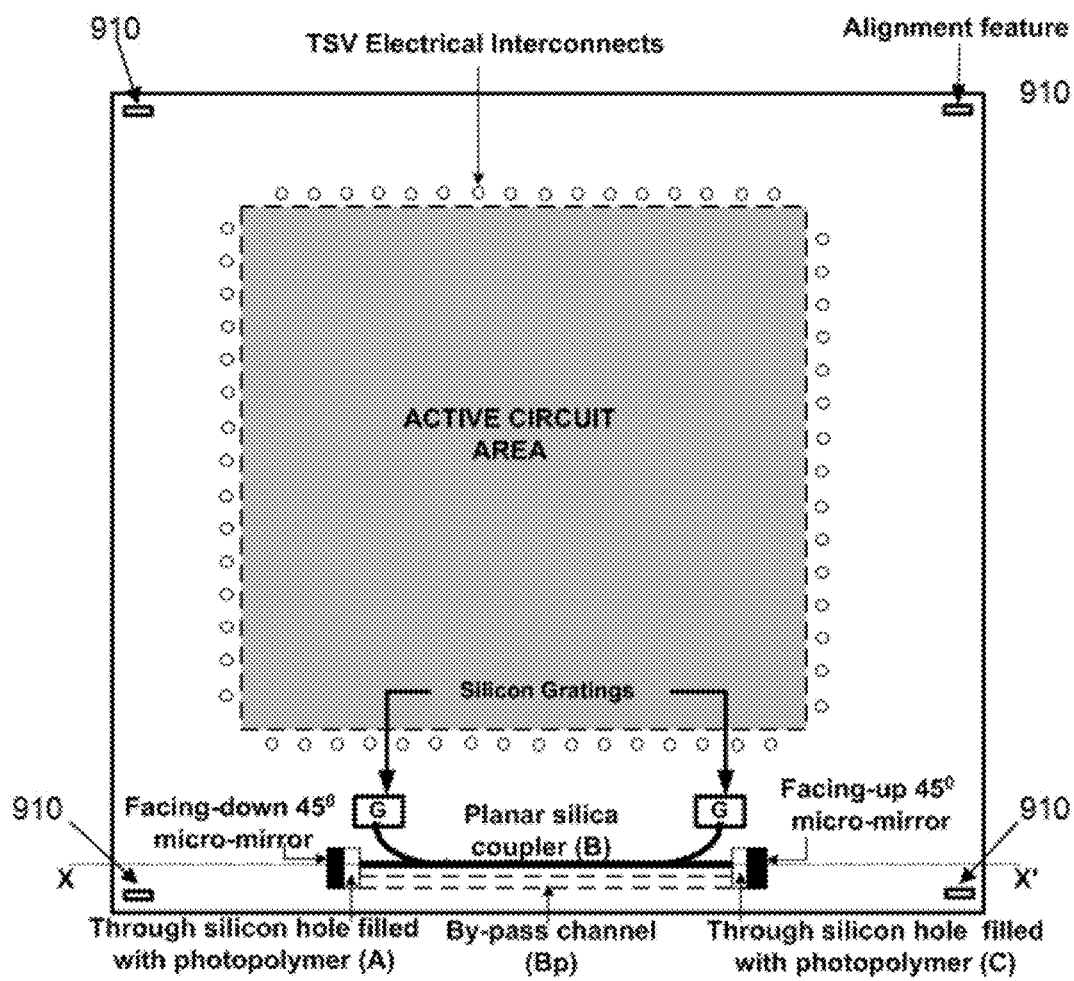
FIG. 9B is a plan view of an integrated circuit having an active circuit area and showing the slot positions of the upper substrate of FIG. 9B.

FIGS. 9A and 9B illustrate an alternative alignment/lock feature or mechanism that may be practiced instead of the mechanism shown in FIGS. 2, 5, and 6. Instead of twisting the upper movable substrate relative to the lower substrate as shown in FIG. 6, the alignment/lock feature or mechanism of FIGS. 9A and 9B is a slide mechanism, where the upper movable substrate is moved horizontally (or vertically) relative to the lower substrate.

The integrated circuit of FIG. 2 is reproduced in FIG. 9B in substance with the modification that the slots are reconfigured as horizontal slots 910 in FIG. 9B. As depicted, the slots (alignment feature) 910 are configured so that lengthwise the slots 910 are aligned horizontally. Alternatively, the slots 910 might be configured lengthwise in a vertical direction.

As shown in FIG. 9A, the top or upper substrate 930 (dotted line) and the lower substrate (solid line) are brought together slightly offset in the horizontal direction. The lower substrate is depicted to have silicon springs 922, 924 in slots 910 in each of the four corners of the top surface of the lower substrate. Corresponding pins 932 are formed in each corner of the bottom surface of the upper substrate 930. A slight rightward shift of the upper substrate 930 sends the pins 932, belonging to the upper substrate, into the locking position between the pair of pre-shaped springs 922, 924.

FIG. 9A shows four sets of such alignment and lock features as an example. The pins 932 and springs 922, 924 can be fabricated by deep reactive ion etching (RIE) of silicon using an STS ICP-RIE tool. The size of the pins 932 and pre-shaped silicon springs 922, 924 have to be appropriately designed to exert the desired amount of force to keep the two substrates well aligned. Again, the concept is illustrated FIG. 9A at the chip level. Adaptation to wafer level alignment requires appropriately locating these 4 sets of alignment/lock structures at properly reference coordinates on the wafer, but lateral shift may be preferred instead of twist.

An optical bus of an integrated circuit, a stacked integrated circuit, a method of fabricating a rear 45° micromirror on a silicon substrate, and an alignment/lock mechanism for use in a stacked integrated circuit have been described. In the light of the foregoing, it will be apparent to those skilled in the art in the light of this disclosure that various modifications and/or substitutions may be made without departing from the scope and spirit of the invention.

What is claimed is:

1. An alignment/lock mechanism for use in a stacked integrated circuit comprising first and second silicon substrates, comprising:
    a pair of pre-shaped silicon springs formed in said first substrate, said springs oppositely facing each other; and
    a pin formed in the second substrate, said pin and said pair of silicon springs adapted for snap-fit engagement in a central portion of said silicon springs.

2. The mechanism as claimed in claim 1, wherein the opposing pre-shaped silicon springs are formed in an elongated region of said first substrate.

3. The mechanism as claimed in claim 1, wherein the springs bulge towards each other from opposite sides and in the central portions of said springs, an indentation is formed in each spring, to which said locking pin can snap fit.

4. A stacked integrated circuit, comprising:
    first and second silicon substrates comprising an alignment/lock mechanism comprising a pair of pre-shaped silicon springs formed in said first substrate, said springs oppositely facing each other; and a pin formed in the second substrate, said pin and said pair of silicon springs adapted for snap-fit engagement in a central portion of said silicon springs.

5. The integrated circuit as claimed in claim 4, wherein said first and second silicon substrates comprise a plurality of the alignment/lock mechanisms situated in different portions of said first and second silicon substrates.

* * * * *